United States Patent
Cho

(10) Patent No.: US 7,227,488 B2
(45) Date of Patent: Jun. 5, 2007

(54) LOW-POWER CMOS IMAGE DEVICE WITH ANALOG-TO-DIGITAL CONVERTER CIRCUIT

(75) Inventor: Tae-Hee Cho, Suwon-shi (KR)

(73) Assignee: Samsung Electronics, Co., Ltd., Suwon (KR)

( * ) Notice: Subject to any disclaimer, the term of this patent is extended or adjusted under 35 U.S.C. 154(b) by 848 days.

(21) Appl. No.: 10/390,853

(22) Filed: Mar. 18, 2003

(65) Prior Publication Data
US 2004/0021787 A1 Feb. 5, 2004

(30) Foreign Application Priority Data
Jul. 30, 2002 (KR) ............... 10-2002-0044984

(51) Int. Cl.
*H03M 1/12* (2006.01)
(52) U.S. Cl. .................. 341/155; 341/122
(58) Field of Classification Search ........... 341/118, 341/120, 155, 156, 138, 164, 122
See application file for complete search history.

(56) References Cited

U.S. PATENT DOCUMENTS

| | | | | |
|---|---|---|---|---|
| 3,905,028 A * | 9/1975 | Wintz et al. | ............ | 341/138 |
| 4,118,698 A * | 10/1978 | Becker | ............ | 341/120 |
| 4,196,420 A * | 4/1980 | Culmer et al. | ............ | 341/156 |
| 4,476,456 A * | 10/1984 | Domogalla | ............ | 341/118 |
| 4,811,018 A * | 3/1989 | Sakata | ............ | 341/139 |
| 5,012,247 A * | 4/1991 | Dillman | ............ | 341/172 |
| 5,877,715 A * | 3/1999 | Gowda et al. | ............ | 341/122 |
| 6,133,862 A * | 10/2000 | Dhuse et al. | ............ | 341/118 |
| 6,239,734 B1 * | 5/2001 | Bae et al. | ............ | 341/164 |
| 6,903,670 B1 * | 6/2005 | Lee et al. | ............ | 341/118 |

FOREIGN PATENT DOCUMENTS

| | | |
|---|---|---|
| JP | 11-266399 | 9/1999 |
| JP | 13-186421 | 7/2001 |

OTHER PUBLICATIONS

With English Abstract Only, no date.

* cited by examiner

*Primary Examiner*—Jean Bruner Jeanglaude
(74) *Attorney, Agent, or Firm*—F. Chau & Associates, LLC

(57) ABSTRACT

Disclosed is a signal processing circuit which outputs a digital word corresponding to a current source controlled by a physical response. The signal processing circuit includes an analog integrated circuit for generating an analog signal in response to a time varying reference signal and a signal corresponding to the current source controlled by the physical response, a reference signal generator for generating a reference signal, a comparator for comparing the analog signal with the reference signal, an output circuit for generating the digital word indicating a time interval defined by a start signal and an end signal indicating a transition of an output of the comparator, and a controller inactivating the comparator in response to the end signal.

14 Claims, 4 Drawing Sheets

LOW-POWER CMOS IMAGE DEVICE WITH ANALOG-TO-DIGITAL CONVERTER CIRCUIT

CROSS-REFERENCE TO RELATED APPLICATION

This application claims priority to Korean Patent Application No. 2002-44984, filed on Jul. 30, 2002, which is herein incorporated by reference in its entirety.

FIELD OF THE INVENTION

The present invention relates to electronic components for image sensing, capturing, and signal processing and, in particular, to an active image device which can be fabricated using standard CMOS (Complementary Metal Oxide Semiconductor) processes.

BACKGROUND

Charge Coupled Device (CCD) imaging arrays have made possible high quality imagers now used in consumer camcorder equipment, scanners for FAX machines, and video cameras for a wide range of applications including videoconferencing, and portable equipment for professional TV broadcasting.

With the advent of multimedia communications, there arises a need for low cost solid state image sensors to complement computers and communication devices and thus realize practical video telephones and the like. An image input device is central to any teleconferencing and multimedia application. Recently, CMOS image sensors have been recognized as a viable candidate for the image input device. CMOS image sensors also have utility in other fields such as robotics, machine vision, security surveillance, automotive applications and personal ID systems through fingerprint/retina scan. A distinct advantage of CMOS image sensors (or imagers) is that signal processing circuits can be readily integrated on the same chip as the image, thus enabling design of smart, single-chip image acquisition systems. CMOS imagers can be manufactured at lower cost than that of conventional charge coupled devices (CCDs) using conventional, preinstalled CMOS fabrication lines without any process modification.

Since portable electronic equipment operates using batteries, it is preferable to design such equipment to provide low-power consumption. The use of a low-power image device enables portable electronic equipment to consume less power.

As is well known, light is analog data that varies continuously. For discrete signal processing, analog data is converted into digital data. CMOS image devices (or imagers) incorporate a device that detects the light as an analog signal and converts a detected analog signal into digital data. For this, CMOS image devices typically incorporate an analog-to-digital converter. In this respect, one approach to realize a low-power image device is to reduce power consumption of analog-to-digital converters incorporated in the image device. Accordingly, there is a need for an analog-to-digital converter capable of reducing power consumption, which can be used for a CMOS image device.

SUMMARY OF THE INVENTION

The invention is directed to an analog-to-digital (AD) converter that is capable of reducing power consumption, and in particular, to a low-power CMOS image device that comprises an AD converter that provides reduced power consumption.

According to one aspect of the present invention, an analog-to-digital converter circuit comprises a comparator for comparing an analog input signal with a reference signal; an output circuit for generating a digital word indicating a time interval defined by a start signal and an end signal, wherein the end signal indicates a transition of an output of the comparator; and a controller for inactivating the comparator in response to the end signal. For example, the controller inactivates the comparator when the output of the comparator transitions from an active state to an inactive state.

In another aspect of the present invention, a signal processing circuit outputs a digital word corresponding to a current source controlled by a physical response. The signal processing circuit comprises: an analog integrated circuit for generating an analog signal in response to a time varying reference signal and a signal corresponding to the current source controlled by the physical response; a reference signal generator for generating a reference signal; a comparator for comparing the analog signal with the reference signal; an output circuit for generating the digital word indicating a time interval defined by a start signal and an end signal, wherein the end signal indicates a transition of an output of the comparator; and a controller for inactivating the comparator in response to the end signal. For example, the controller inactivates the comparator when the output of the comparator transitions from an active state to an inactive state. The controller includes an S-R latch that generates a first enable signal in response to an output of the comparator and a second enable signal, the comparator being inactivated or activated by the first enable signal.

BRIEF DESCRIPTION OF THE DRAWINGS

A more complete appreciation of the present invention, and many of the attendant advantages thereof, will become readily apparent as preferred embodiments become better understood by reference to the following detailed description when considered in conjuction with the accompanying drawings in which like reference symbols indicate the same or similar components, wherein.

DESCRIPTION OF PREFERRED EMBODIMENTS

Figure 1:
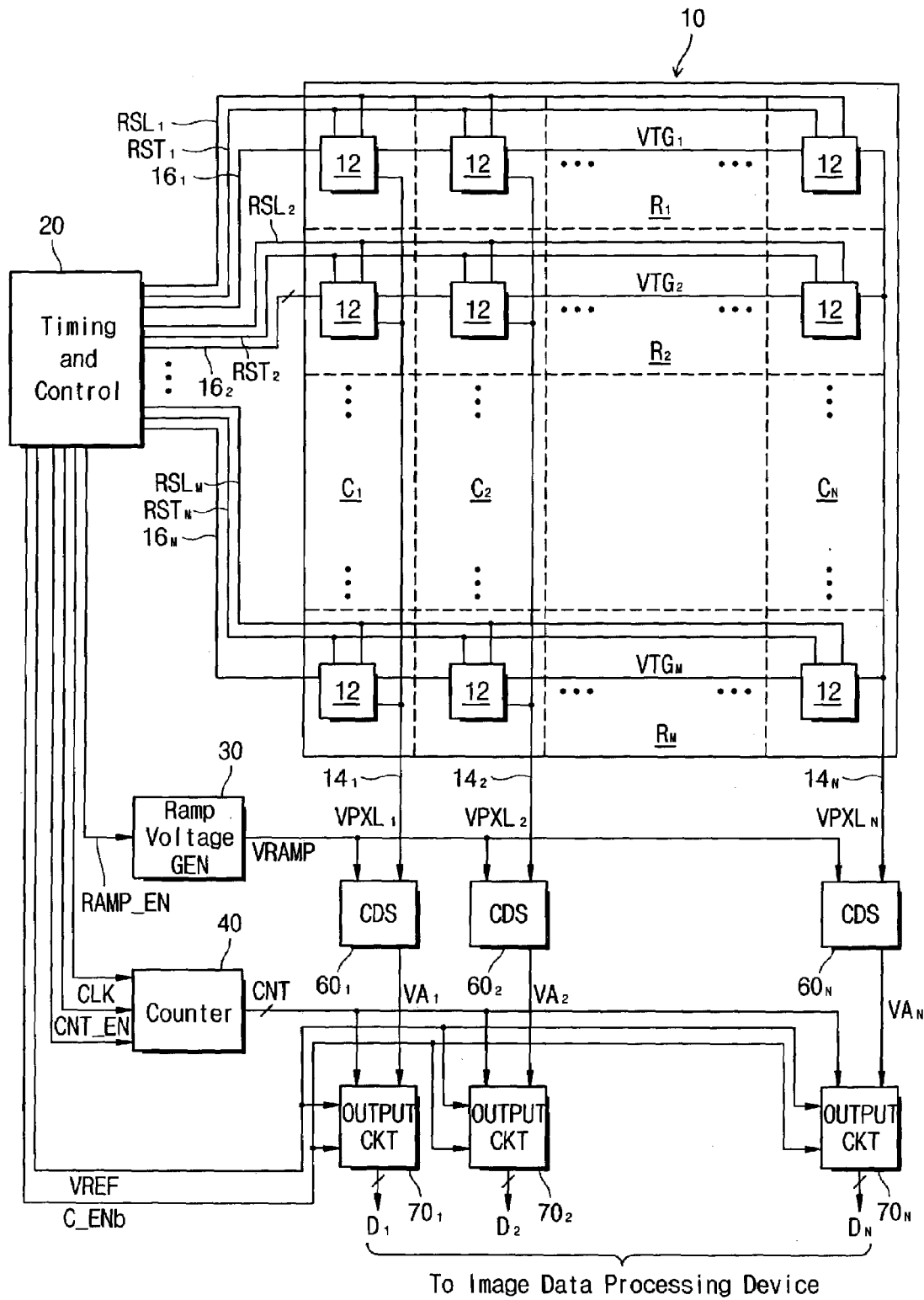
FIG. 1 is a schematic diagram of a CMOS image device according to an embodiment of the present invention.

Preferred embodiments of the present invention will now be described in detail with reference to the attached drawings. FIG. 1 shows a CMOS image device according to a preferred embodiment of the present invention. A CMOS image device includes a sensor array 10, a timing and control logic 20, a ramp voltage generator circuit 30, a counter circuit 40, a plurality of correlated double sampling (CDS) circuits $60_1$–$60_N$, and a plurality of output circuits $70_1$–$70_N$.

The sensor array 10 incorporates a plurality of active cells (or pixels) 12 that are arranged in rows $R_1$–$R_M$ and columns $C_1$–$C_N$. Active cells in a row are simultaneously activated to read out an image from a row of active cells. The timing and control logic 20 provides row select signals onto corresponding row select lines $RSL_1$–$RSL_M$ to select and activate any row. The logic 20 also provides reset signals onto corresponding reset lines $RST_1$–$RST_m$. Charges induced from respective active cells 12 by light are transferred onto corresponding column data lines $14_1$–$14_N$ that are connected with the active cells 12 in respective columns $C_1$–$C_N$. At any time, voltage on each column is determined by image charges from one active cell in a corresponding column and a selected row. Signal lines $16_1$–$16_N$ are connected with active cells 12 in corresponding rows $R_1$–$R_M$, and transfer control signals VTG1–$VTG_M$ for driving corresponding active cells 12.

The CDS circuits $60_1$–$60_N$ are connected with ends of column data lines $14_1$–$14_N$, respectively. Each of the CDS circuit $60_1$–$60_N$ receives voltage on a corresponding column data line and a ramp voltage VRAMP from the ramp voltage generator circuit 30, and generates an analog signal in response to received voltages. For example, the CDS circuit $60_1$ of the first column receives voltage $VPXL_1$ on a column data line $14_1$ and the ramp voltage VRAMP, and generates an analog signal $VA_1$ in response to received voltages $VPXL_1$ and VRAMP. The CDS circuit $60_N$ of the last column receives voltage $VPXL_N$ on a column data line $14_N$ and the ramp voltage VRAMP, and generates an analog signal $VA_N$ in response to received voltages $VPXL_N$ and VRAMP. The ramp voltage generator circuit 30 generates the ramp voltage VRAMP in response to a ramp enable signal RAMP_EN from the timing and control logic 20. The ramp voltage VRAMP is a time varying reference voltage that varies with a predetermined slope.

Each of the output circuits $70_1$–$70_N$ receives an analog signal from a corresponding CDS circuit, a reference voltage VREF from the timing and control logic 20, an output CNT of the counter 40, and an enable signal C_ENb from the timing and control logic 20, and generates a digital word corresponding to a received analog signal. For example, the output circuit $70_1$ in the first column receives an analog signal $VA_1$ from a CDS circuit $60_1$, the reference voltage VREF, the output CNT of the counter 40, and the enable signal C_ENb, and generates a digital word $D_1$ corresponding to the received analog signal $VA_1$. The output circuit $70_N$ in the last column receives an analog signal $VA_N$ from a CDS circuit $60_N$, the reference voltage VREF, the output CNT of the counter 40, and the enable signal C_ENb, and generates a digital word $D_N$ corresponding to the received analog signal $VA_N$.

Figure 2:
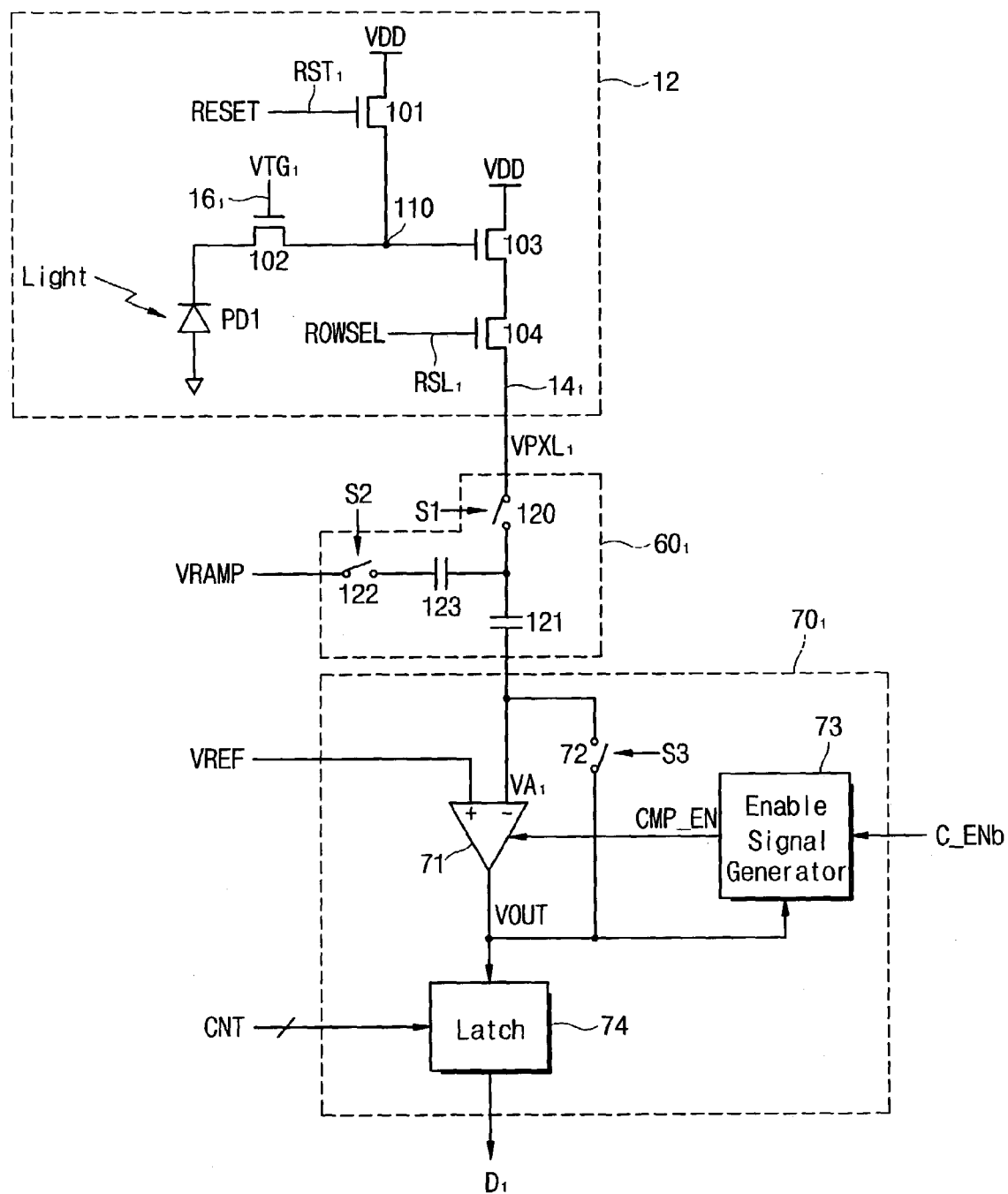
FIG. 2 is a schematic diagram of a correlated double sampling (CDS) circuit and an output circuit according to embodiments of the invention.

FIG. 2 is a circuit diagram of a CDS circuit and an output circuit according to embodiments of the invention, which correspond to one column of a sensor array in FIG. 1. A CDS circuit $60_1$ and an output circuit $70_1$ corresponding to the first column $14_1$ are illustrated in FIG. 2, but it is well understood to one of ordinary skill in the art that circuits corresponding to remaining columns are constructed in the same way as in FIG. 2.

Referring to FIG. 2, an active cell 12 includes four NMOS transistors (101, 102, 103 and 104) and a photodiode PD1. The NMOS transistor 101 whose gate is connected with a reset line $RST_1$ has its current path formed between a power supply voltage VDD and an internal node 110. A reset signal RESET is transferred via the reset line $RST_1$. The NMOS transistor 102 has its gate connected to a signal line $16_1$ and its current path formed between the internal node 110 and a cathode of the photodiode PD1. An anode of the photodiode PD1 is grounded, and a control signal $VTG_1$ is transferred via the signal line $16_1$. The NMOS transistors 103 and 104 are connected between the power supply voltage VDD and the column data line $14_1$. A gate of the NMOS transistor 103 is connected with the internal node 110, and a gate of the NMOS transistor 104 is connected to receive a row select signal ROWSEL on a row select line $RSL_1$.

In the aforementioned active cell structure, when the photodiode PD1 is exposed to light, voltage $VPXL_1$ of the column data line $14_1$ will be determined according to the intensity of the light. For example, when the light is intense the voltage $VPXL_1$ becomes lower in level than that when the light is weak.

The CDS circuit $60_1$ incorporates two switches (120, 122) and two capacitors (121, 123). The switch 120 is operatively connected to the column data line $14_1$ and the capacitor 121. The switch 122 is operatively connected to a ramp voltage VRAMP input and the capacitor 123. The capacitor 121 is operatively connected to the capacitor 123 and the output circuit $70_1$. The switches (120, 122) are controlled by corresponding control signals (S1, S2) that are provided from the timing and control logic 20 in FIG. 1.

The output circuit $70_1$ includes a comparator 71, a switch 72, an enable signal generator 73, and a latch 74. The comparator 71 has its non-inverting input terminal connected to a reference voltage VREF, which is received from the timing and control logic 20 and its inverting input terminal connected to an analog signal $VA_1$, which is received from the CDS circuit $60_1$. The reference voltage VREF, for example, is half a power supply voltage VDD/2. The comparator 71 compares a voltage of the analog signal $VA_1$ with the reference voltage VREF to output a signal VOUT based on a comparison result. The switch 72 is connected between inverting input and output terminals of the comparator 71, and is switched on or off by a control signal S3 that is provided from the timing and control logic 20. The enable signal generator 73 generates an enable signal CMP_EN in response to an output VOUT of the comparator 71 and a control signal C_ENb from the timing and control logic 20. The enable signal generator 73 functions as a controller for activating or inactivating the comparator 71. The latch 74 latches an output value CNT of the counter 40 (FIG. 1) when the output VOUT transitions from an active state to an inactive state.

Figure 3:
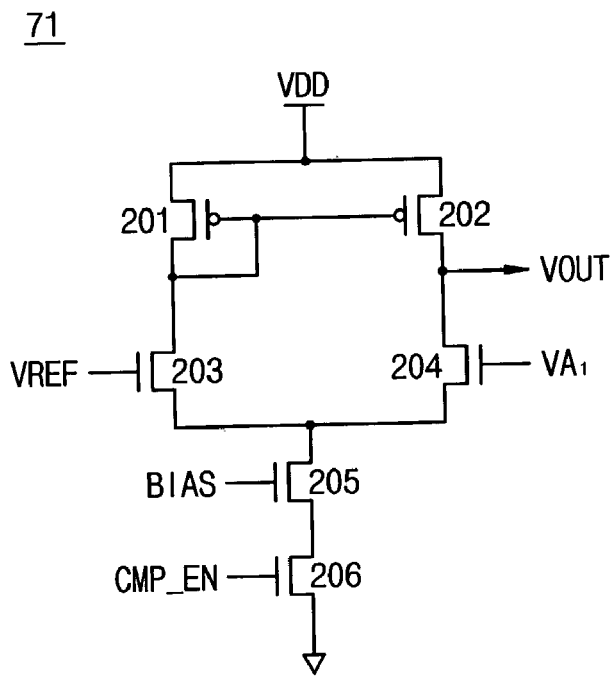
FIG. 3 is a circuit diagram of a comparator according to an embodiment of the invention, which is preferably used in the circuit of FIG. 2.

FIG. 3 is a preferred embodiment of the comparator 71 illustrated in FIG. 2. The comparator 71 is preferably a differential amplifier that includes two PMOS transistors (201, 202) and four NMOS transistors (203, 204, 205, and 206). The PMOS transistor 201 has its source connected with a power supply voltage VDD. The PMOS transistor 202 has its source connected with the power supply voltage VDD, its gate connected to a gate of the PMOS transistor 201, and its drain connected to an output terminal VOUT. A drain of the NMOS transistor 203 is connected in common with the drain and gate of the transistor 201, and a gate thereof is connected to receive a reference voltage VREF. The NMOS transistor 204 whose gate is connected with an analog signal $VA_1$ has its drain connected to the output terminal VOUT. The NMOS transistors (205, 206) are connected between a common-source node of the transistors (203, 204) and a ground voltage. A gate of the transistor 205 is connected to a bias voltage BIAS, and a gate of the transistor 206 is connected to receive an enable signal CMP_EN from the enable signal generator 73 in FIG. 2.

When the enable signal CMP_EN is at a high level, the comparator 71 compares the reference voltage VREF with the analog voltage $VA_1$ to output a signal VOUT as a comparison result. On the other hand, when the enable signal CMP_EN is at a low level, the comparator 71 does not operate.

Figure 4:
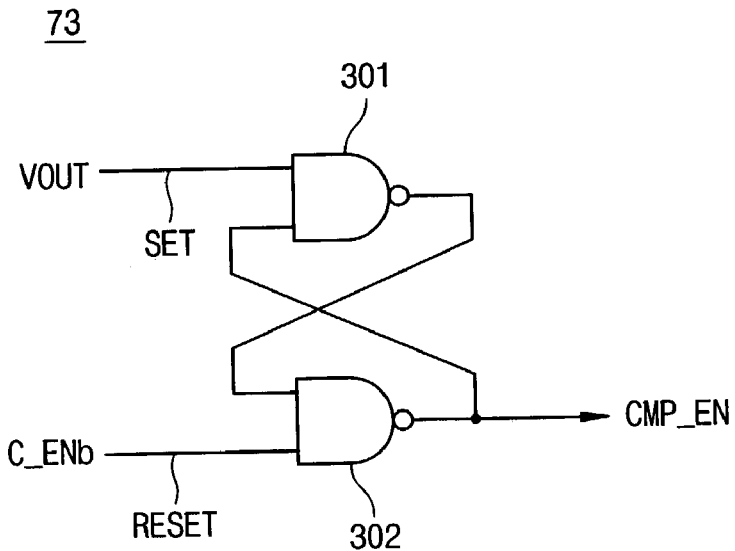
FIG. 4 is a circuit diagram of an enable controller according to an embodiment of the invention, which is preferably used in the circuit of FIG. 2.

FIG. 4 is a preferred embodiment of the enable signal generator 73 illustrated in FIG. 2. The enable signal generator 73 preferably includes an S-R latch that receives an output VOUT of a comparator 71 in FIG. 2 and a control signal C_ENb to generate an enable signal CMP_EN. The S-R latch includes two NAND gates (301, 302) which are connected as illustrated in FIG. 4. In accordance with this structure, the enable signal CMP_EN is inactivated low when the output VOUT transitions from a high level to a low level after a low-to-high transition of the control signal C_ENb.

Figure 5:
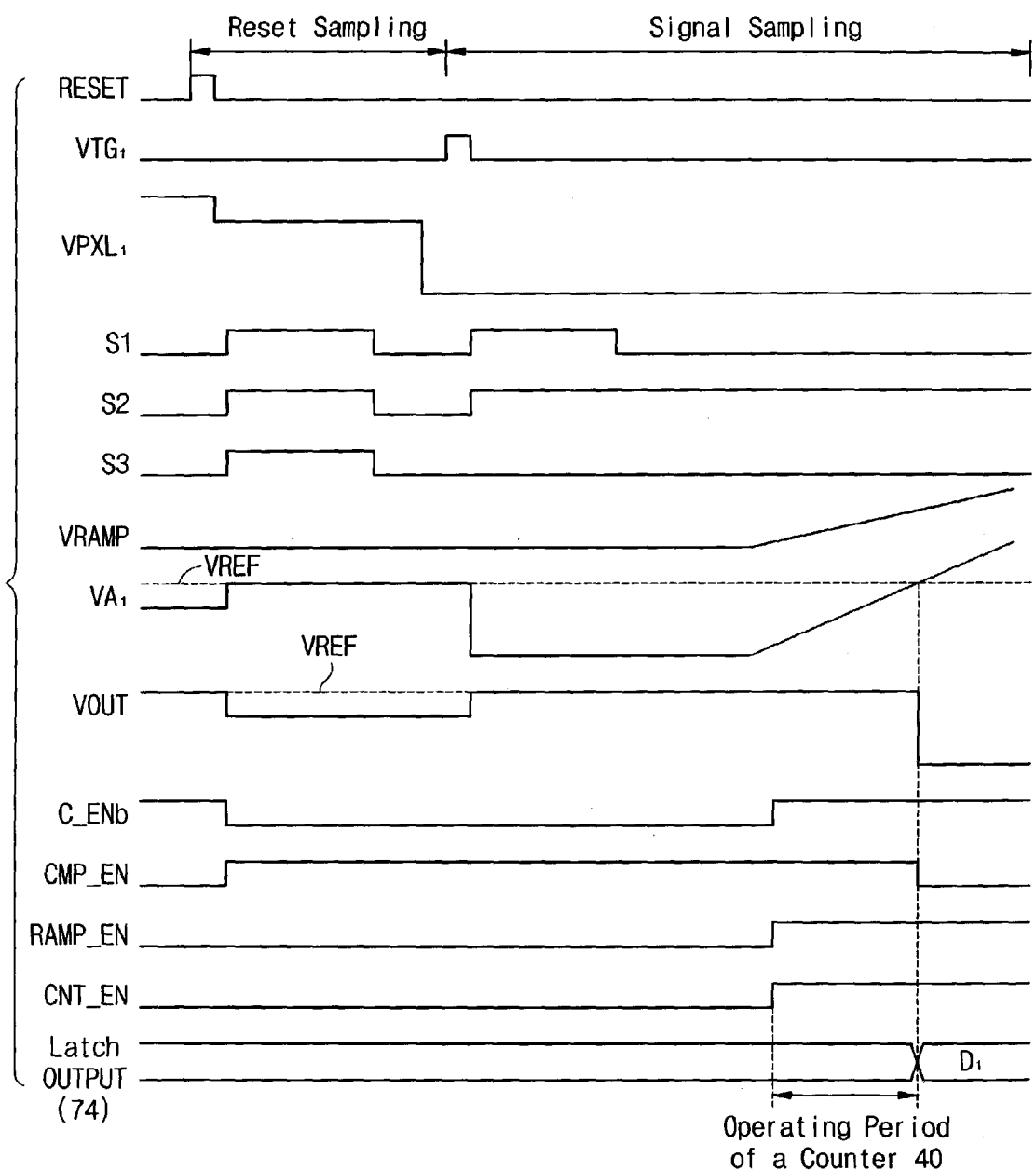
FIG. 5 is a timing diagram for describing an operation of a CMOS image device according to an embodiment of the present invention.

FIG. 5 is a timing diagram for describing an operation of a CMOS image device according to an embodiment of the present invention. An operation of the present CMOS image device will be more fully described with reference to FIGS. 2 to 5. It is assumed that a row select signal ROWSEL connected to an active cell 12 in the first row $R_1$ and column $C_1$ is activated.

In a reset sampling period, when a reset signal RESET on a signal line $RST_1$ is at a high level, the node 110 is charged to a voltage of (VDD-Vth) via NMOS transistor 101 (wherein Vth is a threshold voltage of the NMOS transistor 101). At this time, voltage $VPXL_1$ on column data line $14_1$ increases in proportion to voltage of the internal node 110. For instance, since the amount of current flowing through NMOS transistor 103 as a source follower is determined by voltage of the internal node 110, the voltage $VPXL_1$ on column data line $14_1$ increases in proportion to the voltage of the internal node 110. On the other hand, voltage variation of the internal node 110 is reflected on the column data line $14_1$ through the NMOS transistors (103, 104). The voltage $VPXL_1$ on the column data line $14_1$ will be detected by CDS circuit $60_1$.

As illustrated in FIG. 5, control signals (S1, S2, and S3) have a "high" logic level during a reset sampling period, so that switches (120, 122, and 72) are activated, respectively. As the inverting input and output terminals of comparator 71 are interconnected via the switch 72, the inverting input terminal of the comparator 71 has a reference voltage VREF(=VDD/2). For example, as an input signal of the inverting input terminal of the comparator 71, an analog signal $VA_1$ is equal to the reference voltage VREF. When the control signals (S1, S2, and S3) transition to a low level, the analog signal $VA_1$ continues to be equal to the reference voltage VREF due to charges in capacitor 121.

In a signal sampling period, as signal line $VTG_1$ of a selected row is pulsed high, charges on the internal node 110 are transferred to photodiode PD1. The voltage across the photodiode PD1 corresponds to the intensity of light, and voltage of the internal node 110 becomes a gate voltage of source follower transistor 103. Therefore, voltage $VPXL_1$ of column data line $14_1$ becomes the voltage corresponding to the voltage of the internal node 110. In the signal sampling period, the switches (120, 122) are turned on in response to high-level signals (S1, S2), respectively.

At this time, voltage of analog signal $VA_1$ is lowered to the same as varied amplitude of the voltage $VPXL_1$. Enable signal generator 73 activates enable signal CMP_EN having a high logic level in response to a control signal C_ENb of a low logic level, which activates the comparator 71.

And then, the control signal S1 transitions from a high logic level to a low logic level and the control signal S2 is maintained high. After the control signal S1 transitions from a high level to a low level, control signals RAMP_EN and CNT_EN all are activated high, as illustrated in FIG. 5. At this time, the C_ENb signal is inactivated high. A ramp voltage generator 30 generates a ramp voltage VRAMP in response to activation of the signal RAMP_EN. As illustrated in FIG. 5, the ramp voltage VRAMP increases with a constant slope. Since the control signal S2 is at a high level, the voltage of the analog signal $VA_1$ also increases in proportion to increase the ramp voltage VRAMP. Meanwhile, the counter 40 (FIG. 1) is activated by activation of the signal CNT_EN and counts cycles of a clock signal CLK from a timing and control logic 20.

The comparator 71 compares the voltage of the analog signal $VA_1$ with the reference voltage VREF. If the voltage of the analog signal $VA_1$ is higher than the reference voltage VREF, latch 74 receives and latches an output value CNT from the counter 40 when an output signal VOUT transitions from a high level to a low level. Data in the latch 74 will be provided to an image input device (or an image data processing device) as a digital word $D_1$ corresponding to the analog signal $VA_1$.

Meanwhile, the enable signal generator 73 inactivates the enable signal CMP_EN low in response to a high-to-low transition of the signal VOUT. This inactivation of the enable signal CMP_EN causes the comparator 71 to be inactivated. At this time, data in the latch 74 continues to be maintained without modification.

An operating time interval of the comparator 71 is measured from an activation point of the enable signal CMP_EN to an inactivation point thereof, for example, until voltage of the analog signal $VA_1$ becomes higher than the reference voltage, as illustrated in FIG. 5. An inactivated state of the comparator 71 is maintained until the enable signal CMP_EN is activated again. By so doing, power consumption is reduced as compared with the case that the comparator 71 is always activated while a CMOS image device operates. The intensity of light received by the photodiode PD1 corresponds to a time until the voltage of the analog signal $VA_1$ becomes higher than the reference voltage VREF after starting to increase with a constant slope. For example, an inactive period of the comparator 71 is in inverse proportion to the intensity of the light received to the photodiode PD1. Also, although input signals $VA_1$ and VREF to the comparator 71 are changed owing to unwanted noise, the digital word $D_1$ in the latch 74 is not modified. Accordingly, there is reduced the affect on the digital word due to noise caused after a latch operation is completed.

The invention has been described using exemplary preferred embodiments. However, it is to be understood that the scope of the invention is not limited to the preferred embodiments disclosed through the specification. On the contrary, it is intended to cover various modifications and similar arrangements. The scope of the claims, therefore, should be accorded the broadest interpretation to encompass all such modifications and similar arrangements.

What is claimed is:

1. An analog-to-digital converter circuit comprising:
   a comparator for comparing an analog input signal with a reference signal;
   an output circuit for generating a digital word indicating a time interval defined by a start signal and an end signal, wherein the end signal indicates a transition of an output of the comparator; and a controller for inactivating the comparator in response to the end signal.

2. The analog-to-digital converter circuit according to claim 1, wherein the controller inactivates the comparator when the output of the comparator transitions from an active state to an inactive state.

3. A signal processing circuit which outputs a digital word corresponding to a current source controlled by a physical response, comprising:

an analog integrated circuit for generating an analog signal in response to a time varying reference signal and a signal corresponding to the current source controlled by the physical response;

a reference signal generator for generating a reference signal; a comparator for comparing the analog signal with the reference signal;

an output circuit for generating the digital word indicating a time interval defined by a start signal and an end signal, wherein the end signal indicates a transition of an output of the comparator; and a controller for inactivating the comparator in response to the end signal.

4. The signal processing circuit according to claim 3, wherein the controller inactivates the comparator when the output of the comparator transitions from an active state to an inactive state.

5. The signal processing circuit according to claim 4, wherein the controller comprises, an S-R latch that generates a first enable signal in response to an output of the comparator and a second enable signal, the comparator being inactivated or activate by the first enable signal.

6. The signal processing circuit according to claim 5, wherein the comparator comprises:

a first transistor having a source connected to a power supply voltage, a drain, and a gate;

a second transistor having a source connected to the power supply voltage, a drain, and a gate connected commonly to the gate and drain of the first transistor;

a third transistor having a drain connected to the drain of the first transistor, a source, and a gate connected to receive the reference signal;

a fourth transistor having a drain connected to the drain of the second transistor, a source connected to the source of the third transistor, and a gate connected to receive the analog signal;

a fifth transistor having a drain connected with a common-source node of the third and fourth transistors, a source, and a gate connected to receive a bias voltage; and a sixth transistor having a drain connected to the source of the fifth transistor, a source grounded, and a gate connected to receive the first enable signal.

7. The signal processing circuit according to claim 3, wherein the analog integrated circuit comprises:

a signal generator for generating the signal corresponding to the current source; and a correlated double sampling signal having a first input terminal connected to receive the signal corresponding to the current source, a second input terminal connected to receive the time varying reference signal, and an output terminal outputting the analog signal.

8. The signal processing circuit according to claim 7, wherein the correlated double sampling circuit comprises:

a first capacitor connected to the output terminal;

a first switch for selectively connecting the first capacitor and the first input terminal, in response to a first switch control signal; a second capacitor connected to the first capacitor; and a second switch for selectively connecting the second capacitor and he time varying reference signal, in response to a second switch control signal.

9. The signal processing circuit according to claim 3, wherein the time varying reference signal is a ramp signal that varies with a predetermined slope according to the start signal.

10. The signal processing circuit according to claim 3, further comprising a counter that counts cycles of a clock signal in response to a counter enable signal, wherein the output circuit generates an output of the counter s the digital word when an output of the comparator transitions from an active level to an inactive level.

11. A method for performing analog-to-digital conversion in a CMOS image device, the method comprising the steps of:

generating an analog signal in response to a time varying reference signal and a voltage of column data line of a sensor array;

comparing the analog signal with a reference signal and outputting a comparing signal based on the result of the comparing;

outputting a digital word to the image device when the comparing signal transition from a first state to a second state; and suspending the comparing step upon said transition of the comparing signal.

12. The method according to claim 11, wherein the time varying reference signal is a ramp signal that varies with a predetermined slope.

13. The method according to claim 11, further comprising the step of activating the comparing step in response to a compare enable control signal.

14. The method according to claim 13, wherein the compare enable control signal is activated during a reset sampling period in which a sensor voltage is reset or a sensor in a selected row of the array.

* * * * *